(12) United States Patent
Waseda et al.

(10) Patent No.: US 9,979,015 B2
(45) Date of Patent: May 22, 2018

(54) NONAQUEOUS ELECTROLYTIC SOLUTION SECONDARY BATTERY

(71) Applicant: TOYOTA JIDOSHA KABUSHIKI KAISHA, Toyota-shi, Aichi (JP)

(72) Inventors: Tetsuya Waseda, Nagoya (JP); Takeshi Abe, Toyota (JP); Yoshitomo Takebayashi, Toyota (JP)

(73) Assignee: TOYOTA JIDOSHA KABUSHIKI KAISHA, Toyota-shi, Aichi (JP)

( * ) Notice: Subject to any disclaimer, the term of this patent is extended or adjusted under 35 U.S.C. 154(b) by 0 days. days.

(21) Appl. No.: 15/346,152

(22) Filed: Nov. 8, 2016

(65) Prior Publication Data

US 2017/0141386 A1 May 18, 2017

(30) Foreign Application Priority Data

Nov. 12, 2015 (JP) ................. 2015-222486

(51) Int. Cl.
| | |
|---|---|
| *H01M 4/36* | (2006.01) |
| *H01M 4/04* | (2006.01) |
| *H01M 4/587* | (2010.01) |
| *H01M 4/62* | (2006.01) |
| *H01M 10/0525* | (2010.01) |
| *H01M 10/058* | (2010.01) |
| *C23C 16/40* | (2006.01) |
| *H01M 4/485* | (2010.01) |
| *H01M 4/02* | (2006.01) |

(52) U.S. Cl.
CPC ............ *H01M 4/366* (2013.01); *C23C 16/40* (2013.01); *H01M 4/0428* (2013.01); *H01M 4/485* (2013.01); *H01M 4/587* (2013.01); *H01M 4/62* (2013.01); *H01M 4/625* (2013.01); *H01M 10/058* (2013.01); *H01M 10/0525* (2013.01); *H01M 2004/027* (2013.01); *H01M 2220/20* (2013.01); *Y02E 60/122* (2013.01)

(58) Field of Classification Search
CPC ............. H01M 10/0525; H01M 4/366; H01M 4/0428; H01M 4/485; H01M 4/587; H01M 4/62; H01M 4/625; H01M 10/058
See application file for complete search history.

(56) References Cited

U.S. PATENT DOCUMENTS

2012/0135306 A1* 5/2012 Temmyo ............... H01M 4/131
429/211

FOREIGN PATENT DOCUMENTS

| | | |
|---|---|---|
| JP | 2000-348719 A | 12/2000 |
| JP | 2003173770 A | 6/2003 |
| JP | 2015-162356 A | 9/2015 |

* cited by examiner

*Primary Examiner* — Oi K Conley
(74) *Attorney, Agent, or Firm* — Sughrue Mion, PLLC

(57) ABSTRACT

The present teaching provides a nonaqueous electrolytic solution secondary battery in which both a satisfactory high-rate characteristic and a high cycle characteristic (prevention of decrease in capacity) are realized. The nonaqueous electrolytic solution secondary battery of the present teaching includes a positive electrode provided with a positive electrode active material layer, a negative electrode provided with a negative electrode active material layer, and a nonaqueous electrolytic solution. The negative electrode active material layer includes a negative electrode active material and carbon black. A coating film made of a lithium transition metal composite oxide having lithium ion conductivity is formed on at least part of a surface of the carbon black.

4 Claims, 4 Drawing Sheets

NONAQUEOUS ELECTROLYTIC SOLUTION SECONDARY BATTERY

BACKGROUND OF THE INVENTION

1. Field of the Invention

The present teaching relates to a nonaqueous electrolytic solution secondary battery, and more particularly to a negative electrode material for a nonaqueous electrolytic solution secondary battery. The present application claims priority to Japanese Patent Application No. 2015-222486 filed on Nov. 12, 2015, the entire contents of which are incorporated by reference in the present description.

2. Description of the Related Art

Nonaqueous electrolytic solution secondary batteries represented by lithium ion secondary batteries are low in weight and make it possible to obtain a high energy density, and thus have been widely used as portable power sources for personal computers or portable terminals and also as drive power sources for vehicles.

Meanwhile, nonaqueous electrolytic solution secondary batteries, such as lithium ion secondary batteries, which are used as drive power sources for vehicles need to be charged or discharged at a high current over a short period of time. Therefore, an excellent rapid charge-discharge characteristic (that is, a high-rate characteristic) is required for drive power sources for vehicles.

Furthermore, nonaqueous electrolytic solution secondary batteries, such as lithium ion secondary batteries, which are used as drive power sources for vehicles need to demonstrate continuously stable performance even in repeated charge-discharge cycling in any number of cycles over a long period of time after installation on a vehicle. For this reason, excellent durability (that is, a cycle characteristic) is also required for drive power sources for vehicles.

A variety of approaches have been attempted to improve the aforementioned characteristics. One of them is the improvement of a negative electrode material which is used in the nonaqueous electrolytic solution secondary battery. As an example of such technique, Japanese Patent Application Publication No. 2000-348719 discloses a nonaqueous electrolytic solution secondary battery in which a high-rate characteristic is improved by reducing the internal resistance of a negative electrode by obtaining smooth lithium ion diffusion inside the negative electrode. In the negative electrode of such a nonaqueous electrolytic solution secondary battery, a negative electrode active material layer is formed that includes a negative electrode active material formed of a graphite material and carbon black characterized by a dibutyl phthalate (DBP) absorption amount being equal to or greater than a predetermined value.

Japanese Patent Application Publication No. 2000-348719 indicates that the ability of the negative electrode to retain the nonaqueous electrolytic solution is increased by including such carbon black with a high DBP absorption amount in the negative electrode active material layer within a range from 0.05% by weight (inclusive) to 5% by weight (inclusive), which makes it possible to obtain smooth lithium ion diffusion between the graphite particles which are the positive electrode active material.

SUMMARY OF THE INVENTION

However, in the negative electrode active material layer of the lithium ion secondary battery of the configuration disclosed in Japanese Patent Application Publication No. 2000-348719, since the carbon black contained in the negative electrode active material layer has a large specific surface area, a reaction occurs between the carbon black and the nonaqueous electrolytic solution. As a result, the battery capacity is decreased. This decrease in battery capacity means the decrease in durability (cycle characteristic) which is undesirable.

Accordingly, the present teaching aims at improving the performance of a nonaqueous electrolytic solution secondary battery on the basis of the approach in which the negative electrode material is improved, such as disclosed in Japanese Patent Application Publication No. 2000-348719, and it is an objective of the present teaching to provide a nonaqueous electrolytic solution secondary battery in which both a satisfactory high-rate characteristic and a satisfactory cycle characteristic (prevention of decrease in capacity) are realized.

The inventors have conducted a comprehensive research of negative electrode materials for nonaqueous electrolytic solution secondary batteries, typically, lithium ion secondary batteries, and have confirmed that although the addition of carbon black together with a negative electrode active material to the negative electrode active material layer can be found to improve the high-rate characteristic, repeated charging and discharging advances the reductive decomposition of the electrolytic solution in the negative electrode, and a passivation film forms and grows on the negative electrode surface and causes a decrease in capacity. The results of subsequent research have demonstrated that such a decrease in capacity can be avoided by forming a coating film made of a lithium transition metal composite oxide having lithium ion conductivity on the surface of carbon black contained in the negative electrode active material. This finding led to the completion of the present teaching.

Thus, in order to attain the abovementioned objective, the present teaching provides a nonaqueous electrolytic solution secondary battery including a positive electrode having a positive electrode active material layer, a negative electrode having a negative electrode active material layer, and a nonaqueous electrolytic solution.

In the nonaqueous electrolytic solution secondary battery disclosed herein, the negative electrode active material layer includes a negative electrode active material and carbon black. The battery is characterized in that a coating film made of a lithium transition metal composite oxide having lithium ion conductivity is formed on at least part of a surface of the carbon black.

In the nonaqueous electrolytic solution secondary battery of such a configuration, carbon black is included in addition to the negative electrode active material in the negative electrode active material layer, and a coating film made of a lithium transition metal composite oxide having lithium ion conductivity is formed on the surface of the carbon black. As a result, it is possible to suppress the decomposition of the nonaqueous electrolytic solution in the negative electrode (more specifically, in the negative electrode active material layer) even in continuous repetitive charging and discharging, and eventually suppress the generation and growth of a passivation film on the surface and inhibit the decrease in capacity, while maintaining a satisfactory high-rate characteristic.

Therefore, with the nonaqueous electrolytic solution secondary battery disclosed herein, both a satisfactory high-rate characteristic and a satisfactory cycle characteristic (durability) can be realized.

In the desired embodiment of the nonaqueous electrolytic solution secondary battery disclosed herein, the coating film is characterized by including a lithium-ion-conductive lithium transition metal composite oxide that includes niobium (Nb) as a transition metal element.

The lithium transition metal composite oxide including Nb (typically, including niobium with a valence of +5 ($Nb^{5+}$)) (also referred to hereinbelow as "Nb-containing lithium-ion-conductive composite oxide") has a particularly excellent lithium conductivity. Therefore, by using a Nb-containing lithium-ion-conductive composite oxide as a component for forming the coating film, it is possible to suppress more effectively the decrease in capacity occurring in charge-discharge cycling. A Nb-containing lithium-ion-conductive composite oxide which has a low degree of crystallinity is particularly desired.

In another desired embodiment of the nonaqueous electrolytic solution secondary battery disclosed herein, the battery is characterized by that spherical graphite with an average value of circularity of 0.9 or more and an average particle diameter of 5 μm (inclusive) to 15 μm (inclusive) is included as the negative electrode active material.

When spherical graphite particles with a circularity of 0.9 or more are used as the negative electrode active material, the occurrence of voids between the graphite particles in the negative electrode active material layer is facilitated by comparison with the general case in which the negative electrode active material is in the form of flaky graphite particles. By disposing the abovementioned carbon black in the voids, it is possible to improve the retention capability (liquid retention ability) of the nonaqueous electrolytic solution in the negative electrode active material layer and increase the high-rate characteristic more effectively. In addition, the decrease in capacity occurring in charge-discharge cycling can be also effectively suppressed.

Further, according to another aspect of the present teaching that resolves the abovementioned problem, there is provided a method for manufacturing a nonaqueous electrolytic solution secondary battery in which carbon black on which the coating film made of a lithium transition metal composite oxide having lithium ion conductivity has been formed is included in a negative electrode.

Thus, the method for manufacturing a nonaqueous electrolytic solution secondary battery disclosed herein is a method for manufacturing a nonaqueous electrolytic solution secondary battery including a positive electrode provided with a positive electrode active material layer, a negative electrode provided with a negative electrode active material layer, and a nonaqueous electrolytic solution, the method including forming a positive electrode by forming a positive electrode active material layer on a positive electrode collector, and forming a negative electrode by forming a negative electrode active material layer on a negative electrode collector.

Here, the negative electrode active material layer is formed such as to include at least a negative electrode active material and carbon black in which a coating film made of a lithium transition metal composite oxide having lithium ion conductivity is formed on at least part of the surface. The coating film is characterized by being formed by depositing the lithium transition metal composite oxide on the surface of the carbon black by an atomic layer deposition (ALD) method.

Where the ALD method is used, the coating film made of a lithium transition metal composite oxide having lithium ion conductivity can be satisfactorily formed on the surface of carbon black particles, with a thickness that is desired for attaining the objective of the present teaching.

DESCRIPTION OF THE PREFERRED EMBODIMENTS

The desired embodiment of a lithium ion secondary battery which is a typical example of the nonaqueous electrolytic solution secondary battery disclosed herein will be explained below. Features other than those specifically described in the present specification, but necessary for implementing the present teaching can be considered as design matters for a person skilled in the art that are based on the conventional techniques in the pertinent field. A battery to which the present teaching can be applied is not limited to the lithium ion secondary battery of the configuration explained as an embodiment herein, provided that in the nonaqueous electrolytic solution secondary battery disclosed herein, as will be explained hereinbelow in detail, a negative electrode active material and carbon black are included in a negative electrode active material layer and a coating film made of a lithium transition metal composite oxide having lithium ion conductivity is formed on at least part of the surface of the carbon black.

The "nonaqueous electrolytic solution secondary battery", as referred to in the present specification is a secondary battery using an organic solvent in which the electrolytic solution is a nonaqueous system. Further, the "lithium ion secondary battery" is a secondary battery in which lithium ions are used as electrolyte ions included in the nonaqueous electrolytic solution, and charging and discharging are realized by the movement of lithium ions between the positive electrode and negative electrode. The "positive electrode active material" or "negative electrode active material" is an active material (positive electrode active material or negative electrode active material) capable of reversibly occluding and releasing chemical species (in a lithium ion secondary battery, the chemical species are lithium ions) which are charge carriers.

Figure 1:
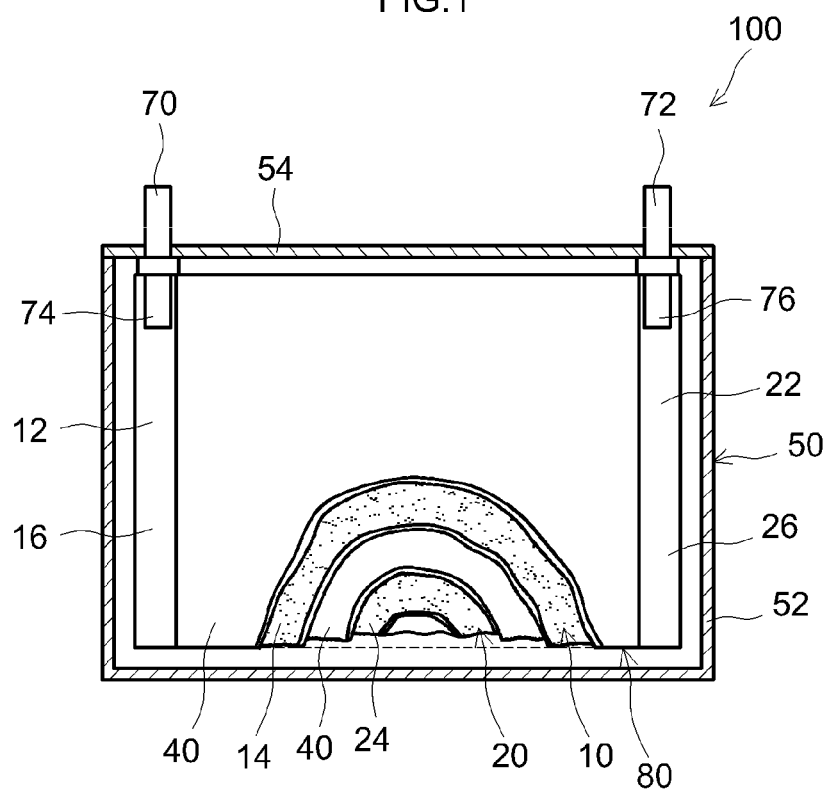
FIG. 1 illustrates schematically the internal configuration of a lithium ion secondary battery as a nonaqueous electrolytic solution secondary battery according to an embodiment.

As depicted in FIG. 1, a lithium ion secondary battery 100 according to the present embodiment is provided with a metal case 50. This case (outer container) 50 is provided with a case main body 52 in the form of a flat rectangular parallelepiped having an opening at the upper end and a lid 54 that closes the opening. The battery case itself is not necessarily made of a metal, and a resin film or a laminated film can be also advantageously used.

In the case 50 depicted in FIG. 1, a positive electrode terminal 70 which is electrically connected to a positive electrode 10 of a wound electrode body 80 and a negative electrode terminal 72 which is electrically connected to a negative electrode 20 are provided on the upper surface of the case (that is, on the lid 54). The flat-shape wound electrode body 80 obtained by laminating the elongated sheet-shaped positive electrode (positive electrode sheet) 10, the elongated sheet-shaped negative electrode (negative electrode sheet) 20 together with a total of two elongated sheet-shaped separators (separator sheets) 40 and winding the laminate is housed together with a nonaqueous electrolytic solution inside the case 50.

A gas discharge mechanism, such as a safety valve, for releasing the gas generated inside the case 50 to the outside of the case 50 is provided in part of the case 50 in the same manner as in the conventional lithium ion secondary batteries of this type. However, this mechanism does not characterize the present teaching and, therefore, the depiction thereof in the drawings and the explanation thereof are omitted.

In the positive electrode sheet 10, a positive electrode active material layer 14 including the positive electrode active material as the main component is provided on both surfaces of an elongated sheet-shaped positive electrode collector 12. However, the positive electrode active material layer 14 is not provided at one side edge in the lateral direction (that is, one end portion in the winding axis direction), which is the direction perpendicular to the longitudinal direction of the positive electrode sheet 10, and a positive electrode active material layer non-formation portion 16 in which the positive electrode collector 12 is exposed over a certain width is formed.

In the present embodiment, the positive electrode active material is not particularly limited. In a lithium ion secondary battery, the positive electrode active material is a material capable of occluding and releasing lithium ions, and a lithium-containing compound including a lithium element and one or two or more transition metal elements (lithium transition metal composite oxide) can be advantageously used. The desired examples include lithium transition metal composite oxides having a crystal structure of a layered rock salt type or a spinel type. Examples of such compounds include lithium-nickel composite oxides (for example, $LiNiO_2$), lithium-cobalt composite oxides (for example, $LiCoO_2$), lithium-manganese composite oxides (for example, $LiMn_2O_4$), and three-component lithium-containing composite oxides such as lithium-nickel-cobalt-manganese composite oxides (for example, $LiNi_{1/3}Co_{1/3}Mn_{1/3}O_2$). Further, polyanion compounds represented by the general formula $LiMPO_4$ or $LiMVO_4$ or $Li_2MSiO_4$ (M in the formulas is at least one or more elements from among Co, Ni, Mn, and Fe) may be also used as the positive electrode active material. The average particle diameter of positive electrode active material particles (secondary particles) is desirably about 1 µm (inclusive) to 25 µm (inclusive). With the positive electrode active material particles of such average particle diameter, satisfactory battery performance can be more stably demonstrated. The average particle diameter of positive electrode active material particles can be determined by measurements based on a method which is well-known in the pertinent field, for example, by a laser diffraction and scattering method.

The positive electrode active material layer 14 can be formed by attaching a composition prepared by mixing the above-described positive electrode active material with various additives (for example, a paste-like (slurry-like) supply material prepared by adding a nonaqueous solvent, or a granulated material obtained by granulating the positive electrode active material together with additives) to the positive electrode collector 12 to a predetermined thickness.

Examples of the additives, other than the positive electrode active material, which are contained in the positive electrode active material layer, include an electrically conductive material and a binder, but the additives are not particularly limited and any additives which have been conventionally used in the lithium ion secondary batteries of this type may be used. For example, a carbon powder such as carbon black or a carbon material such as carbon fibers can be used as the electrically conductive material. A polymer material dissolved in an organic solvent, for example, halogenated vinyl resins such as polyvinylidene fluoride (PVDF) and polyvinylidene chloride (PVDC), and polyalkylene oxides such as polyethylene oxide (PEO) can be used as the binder when a nonaqueous supply material is used in the case of forming the positive electrode active material layer 14 by a paste-like (slurry-like) supply material. Further, when an aqueous supply material is used, a water-soluble polymer material or water-dispersible polymer material, such as polytetrafluoroethylene (PTFE), carboxymethyl cellulose (CMC), and styrene-butadiene rubber (SBR), can be advantageously used.

Meanwhile, similarly to the positive electrode sheet 10, the negative electrode sheet 20 has a configuration in which a negative electrode active material layer 24 including the negative electrode active material as the main component is provided on both surfaces of an elongated sheet-shaped negative electrode collector. However, the negative electrode active material layer 24 is not provided at one side edge in the lateral direction (that is, one end portion in the winding axis direction, this end portion being on the side opposite that of the positive electrode active material layer non-formation portion 16) of the negative electrode sheet 20, and a negative electrode active material layer non-formation portion 26 in which the negative electrode collector 22 is exposed over a certain width is formed.

In the nonaqueous electrolytic solution secondary battery disclosed herein, materials that can be used as the negative electrode active material of the secondary battery of this type can be used individually, in combinations of two or more thereof (in the form of mixtures or composites) or the like.

The desired examples include carbon materials such as graphite, hardly graphitizable carbon (hard carbon), easily graphitizable carbon (soft carbon), carbon nanotubes, and materials structured as combinations thereof. The use of a graphite material is particularly desired. For example, a graphite material which is coated on the surface with amorphous carbon can be advantageously used.

The form of the graphite material to be used as the negative electrode active material is not particularly limited, and flaky or spherical graphite may be used. From the standpoint of obtaining the advantageous effects exhibited by the present teaching, a spherical shape, for example, a shape with an average value of circularity of 0.9 or more is desired. The circularity, as referred to herein, is an indicator that indicates the spheroidization in an image of a graphite particle projected on a two-dimensional plane in scanning electron microscope (SEM) observations. More specifically, the circularity can be determined by the following formula:

Circularity=(circumferential length of true circle having the same area as particle image)/(circumferential length of particle image).

For example, when a particle image in electron microscope observations is a true circle, the circularity is 1. Therefore, the average value of circularity is the average of circularities determined from images of a plurality of particles in electron microscopic observations.

The average particle diameter of the graphite particles is not particularly limited and the particles with an average particle diameter of about 5 μm (inclusive) to 15 μm (inclusive) (for example, spherical graphite defined by the above circularity) can be advantageously used. Where a graphite material, in particular, spherical graphite, formed of particles with an average particle diameter within such a range is used, voids of about 1 μm tend to appear between the graphite particles in the negative electrode active material layer. By disposing carbon black such as described hereinbelow (typically, with an average particle diameter in electron microscope (SEM) observations of 1 μm or less, for example, 10 nm (inclusive) to 100 nm (inclusive)) in the voids, it is possible to improve the retention capability (liquid retention ability) of the nonaqueous electrolytic solution in the negative electrode active material layer and increase the high-rate characteristic more effectively. Further, the decrease in capacity occurring in charge-discharge cycling also can be effectively suppressed. The average particle diameter of negative electrode active material particles can be determined by measurements based on a method which is well-known in the pertinent field, for example, by a laser diffraction scattering method.

In the nonaqueous electrolytic solution secondary battery disclosed herein, carbon black is included in the negative electrode active material layer. The carbon black which is to be used is not particularly limited, but carbon black with satisfactory electric conductivity is desired. For example, typical carbon black such as acetylene black (AB), Ketjen black, and furnace black can be used without limitations. Carbon black with an average particle diameter in electron microscope (SEM) observations of 10 nm (inclusive) to 1 μm (inclusive) (typically, 500 nm or less, for example, 10 nm (inclusive) to 200 nm (inclusive)) is desired. An appropriate amount of carbon black in the negative electrode active material layer is 1 part by mass (inclusive) to 20 parts by mass (inclusive), and the desired amount is 5 part by mass (inclusive) to 15 parts by mass (inclusive), per 100 parts by mass of the negative electrode active material, but these ranges are not particularly limiting. By including the negative electrode active material and carbon black at such a content ratio, it is possible to realize a satisfactory high-rate characteristic.

Further, in the nonaqueous electrolytic solution secondary battery disclosed herein, a coating film made of a lithium transition metal composite oxide having lithium ion conductivity is formed on at least part of the surface of the carbon black contained in the negative electrode active material layer. Due to the presence of the coating film of such a configuration, it is possible to suppress the decomposition of the nonaqueous electrolytic solution caused by the reaction of the carbon black and nonaqueous electrolytic solution and eventually suppress the generation and growth of the surface coating film and inhibit the decrease in capacity, while ensuring the improvement of the high-rate characteristic by the blended carbon black. The transition metal elements, as referred to herein, are metal elements present between Group 3 elements and Group 11 elements of the periodic table of the elements and also zinc-group elements (typically, Zn) among the Group 12 elements.

The type of the lithium transition metal composite oxide having lithium ion conductivity, which serves as a component forming the coating film, is not particularly limited, provided that the above-mentioned objective is attained.

The desired examples include composite oxides which have a perovskite-type structure and include one or two or more transition metal elements such as lanthanum, niobium, and tantalum. Other desired examples include composite oxides which have a garnet-type structure and include one or two or more transition metal elements such as lanthanum, zirconium, niobium, and tantalum. Composite oxides referred to as LISICON, UPON, and NASICON can be also used.

The coating film is desirably configured of a Nb-containing lithium-ion-conductive composite oxide including niobium (Nb) as the transition metal element. By using a Nb-containing lithium-ion-conductive composite oxide as a component for forming the coating film, it is possible to suppress more effectively the decrease in capacity occurring in charge-discharge cycling. A Nb-containing lithium-ion-conductive composite oxide which includes $Nb^{5+}$ is desired, and $LiNbO_3$ is the desired example thereof. A Nb-containing lithium-ion-conductive composite oxide which has a low degree of crystallinity (in particular, which has an amorphous structure) is desired.

A method for forming a coating film configured of such a lithium transition metal composite oxide having lithium ion conductivity (in particular, a Nb-containing lithium-ion-conductive composite oxide) on the surface of carbon black is not particularly limited. A variety of physical or chemical film forming methods can be used.

Examples of such methods include chemical vapor deposition (CVD) methods and physical vapor deposition (PVD) methods, and among them, the deposition of a lithium transition metal composite oxide on the surface of carbon black by the atomic layer deposition (ALD) method is particularly desired.

With the ALD method, atomic layers of the desired compound can be formed in single-layer units on a carbon black surface in a self-controlled manner. Therefore, as a result of using the ALD method, a coating film made of a lithium transition metal composite oxide having lithium ion conductivity can be formed substantially uniformly on the surface of carbon black particles with a thickness that is desired for attaining the objective of the present teaching.

Concerning the ALD method itself, the same process as in the related art may be used and no special modifications are needed. For example, vapors of a plurality of precursors are supplied one after another to carbon black which is a film formation object and disposed in a reaction container (chamber). In the case of a lithium transition metal composite oxide such as $LiNbO_3$, vapors of various organic compounds including transition metals, such as Li and Nb, as constituent metal elements and an oxygen-supplying material (water, ozone, etc.) are successively introduced together with a carrier gas (inert gas such as nitrogen and argon) into a chamber heated to a predetermined temperature range (for example, a temperature range of about 200° C. (inclusive) to 350° C. (inclusive)). As a result, metal atoms separated by decomposition of the precursors are bonded to the surface of carbon black, chemical bonding with oxygen then occurs, and a single-layer coating film of the target compound (lithium transition metal composite oxide such as $LiNbO_3$) is formed as an atomic layer in a self-controlled manner.

The thickness of the coating film (that is, the number of stacked atomic layers) can be controlled by repeating the above-described cycle a predetermined number of times.

The thickness of the coating film is not particularly limited, provided that the thickness is within a range in which the effects of the present teaching can be demonstrated. However, the thickness of the coating film formed on the carbon black surface is desirably within a range of 1 Å (inclusive) to 100 Å (inclusive), and particularly desirably 5 Å (inclusive) to 20 Å (inclusive). With such coating film thickness, it is possible to suppress the decomposition of the nonaqueous electrolytic solution and the formation of a passivation film on the negative electrode surface and improve the durability (suppress the decrease in capacity), without losing the effect produced by the addition of carbon black to the negative electrode active material layer. The thickness of the coating film made of lithium-ion-conductive lithium transition metal composite oxide can be measured, for example, by measuring the thickness of the coating film formed on the carbon black surface with a transmission electron microscope (TEM).

The ratio (coverage ratio) of the coating film formed on the surface of carbon black particles in the surface area of the carbon black particles is not particularly limited, but the coverage ratio can be increased by using a deposition method such as the ALD method. For example, the coverage ratio of the coating film made of a lithium-ion-conductive lithium transition metal composite oxide on the surface of carbon black particles is desirably 70% or more, and particularly desirably 80% or more. The coverage ratio can be measured by measurements by X-ray photoelectron spectroscopy (XPS) or the like.

The negative electrode active material layer 24 can be formed by attaching a composition prepared by mixing the above-described negative electrode active material and carbon black with various additives (for example, a paste-like (slurry-like) supply material prepared by adding an aqueous solvent or a nonaqueous solvent, or a granulated material) to the negative electrode collector 22 to a predetermined thickness.

A binder is an example of the additive. For example, the binder of the same type as that included in the above-described positive electrode active material layer 14 can be used. A thickening agent, a dispersant, etc., can be used, as appropriate, as other additives. For example, carboxymethyl cellulose (CMC) and methyl cellulose (MC) can be advantageously used as the thickening agent.

The separator 40 which is laminated together with the positive electrode sheet 10 on which the positive electrode active material layer 14 has been formed and the negative electrode sheet 20 on which the negative electrode active material layer 24 has been formed by using the above-described materials is a member that separates the positive electrode sheet 10 and the negative electrode sheet 20.

The separator 40 is typically configured of a band-shaped sheet material of a predetermined width having a plurality of fine holes. For example, a separator of a single-layer structure configured of a porous polyolefin resin such as polypropylene (PP) and polyethylene (PE), or a separator of a laminated structure can be used as the separator 40. An insulating inorganic filler layer (for example, a heat-resistant layer formed of a filler such as a metal oxide and metal hydroxide) may be further formed on the surface of the sheet material configured of such resin.

During the lamination, the positive electrode sheet 10 and the negative electrode sheet 20 are stacked with a certain displacement in the lateral direction such that the positive electrode active material layer non-formation portion 16 of the positive electrode sheet 10 and the negative electrode active material layer non-formation portion 26 of the negative electrode sheet 20 protrude from both sides, in the lateral direction, of the separator sheet 40. As a result, the active material layer non-formation portions 16, 26 of the positive electrode sheet 10 and the negative electrode sheet 20 protrude outward from the respective wound core portions (that is, portions where the positive electrode active material layer formation portion of the positive electrode sheet 10, the negative electrode active material layer formation portion of the negative electrode sheet 20, and the two separator sheets 40 are tightly wound together) in the transverse direction with respect to the winding direction of the wound electrode body 80. A positive electrode lead terminal 74 and a negative electrode lead terminal 76 are attached to the positive electrode-side protruding portion (that is, the non-formation portion of the positive electrode active material layer) 16 and the negative electrode-side non-formation portion (that is, the non-formation portion of the negative electrode active material layer) 26, respectively, and electrically connected to the positive electrode terminal 70 and the negative electrode terminal 72, respectively.

Nonaqueous electrolytic solutions same as or similar to those which have been used in the conventional lithium ion secondary batteries can be used without any particular limitation as the electrolytic solution (nonaqueous electrolytic solution). Such nonaqueous electrolytic solutions typically have a composition in which a support salt is included in an appropriate nonaqueous solvent. Examples of the nonaqueous solvent include one or two or more from among ethylene carbonate, propylene carbonate, dimethyl carbonate, diethyl carbonate, ethyl methyl carbonate, 1,2-dimethoxyethane, 1,2-diethoxyethane, tetrahydrofuran, and 1,3-dioxolane. It is desired that solvents obtained by fluorination of the abovementioned carbonate-based solvents, for example, fluorinated cyclic carbonates such as monofluoroethylene carbonate (FEC) and fluorinated chain carbonates such as methyl-2,2,2-trifluoroethyl carbonate (MTFEC) be used.

Further, for example, lithium salts such as $LiPF_6$, $LiBF_4$, $LiAsF_6$, $LiCF_3SO_3$, $LiC_4F_9SO_3$, $LiN(CF_3SO_2)_2$, and $LiC(CF_3SO_2)_3$. A specific example is a nonaqueous electrolytic solution obtained by including $LiPF_6$ at a concentration of about 1 mol/L in a mixed solvent of ethylene carbonate (EC), dimethyl carbonate (DMC), and ethyl methyl carbonate (EMC) (for example, a volume ratio of 3:4:3).

When the nonaqueous electrolytic solution secondary battery (lithium ion secondary battery) 100 according to the present embodiment is assembled, the wound electrode body 80 is accommodated inside the case main body 52 from the upper end opening of the main body 52, and an appropriate nonaqueous electrolytic solution is disposed in (poured into) the case main body 52. The opening is then sealed, for example, by welding to the lid 54, thereby completing the assembling of the lithium ion secondary battery 100 according to the present embodiment. The process of sealing the case 50 and the process of disposing (pouring) the electrolytic solution may be the same as those performed in the manufacture of the conventional lithium ion secondary batteries and do not characterize the present teaching. The construction of the nonaqueous electrolytic solution secondary battery (lithium ion secondary battery) 100 according to the present embodiment is thus completed.

Several test examples relating to the present teaching are explained hereinbelow, but the present teaching is not intended to be limited to the features indicated in the test examples.

<Fabrication of Lithium Ion Secondary Battery (Sample Battery for Evaluation)>

Lithium ion secondary batteries of the following three types were fabricated.

(Sample A) a lithium ion secondary battery in which carbon black is not included in the negative electrode active material layer;

(Sample B) A lithium ion secondary battery in which carbon black is included in the negative electrode active material layer, but a coating film made of a lithium transition metal composite oxide having lithium ion conductivity is not formed on the surface of the carbon black;

(Sample C) A lithium ion secondary battery in which carbon black is included in the negative electrode active material layer, and a coating film made of a lithium transition metal composite oxide having lithium ion conductivity is formed on the surface of the carbon black by the ADL method.

Thus, electrically conductive carbon black (in this case the commercial oil furnace black) with an average particle diameter, based on electron microscope observations, of 10 nm (inclusive) to 100 nm (inclusive) was prepared, and a coating film made of $LiNbO_3$ was formed on the surface thereof in advance by the ALD method. The film thickness was about 5 Å to 10 Å. Further, the coverage ratio was greater than 70%.

For comparison, commercial carbon black on which the coating film made of $LiNbO_3$ was not formed was separately prepared.

Positive electrodes of the lithium ion secondary batteries of Samples A to C were fabricated. More specifically, a paste-like material for forming a positive electrode active material layer was prepared by using a lithium-nickel-manganese composite oxide ($LiNi_{0.5}Mn_{1.5}O_4$) with a spinel structure with an average particle diameter of about 15 μm as a positive electrode active material, acetylene black (AB) as an electrically conductive material, and polyvinylidene fluoride (PVdF) as a binder (binding material), and mixing these materials at a mass ratio of 87:10:3 in N-methyl pyrrolidone (NMP). A sheet-shaped positive electrode was then fabricated by uniformly applying the resulting material to both surfaces of aluminum foil (positive electrode collector: thickness 15 μm), drying, and then performing compression treatment with a roll press.

Negative electrodes of the lithium ion secondary batteries of Samples A to C were fabricated. More specifically, a spherical graphite material with a circularity of 0.9 or more and an average particle diameter of about 10 μm was prepared as a negative electrode active material. A styrene-butadiene rubber (SBR) was used as a binder and carboxymethyl cellulose (CMC) was used as a thickening agent.

For Sample A, a paste-like material for forming a negative electrode active material layer was prepared by mixing the negative electrode active material, SBR, and CMC in ion-exchanged water, without using the carbon black, to obtain a mass ratio of 98:1:1.

For Sample B, a paste-like material for forming a negative electrode active material layer was prepared by using the commercial carbon black on which the coating film made of $LiNbO_3$ was not formed (referred to hereinbelow as "non-coated carbon black") and mixing the negative electrode active material, non-coated carbon black, SBR, and CMC in ion-exchanged water to obtain a mass ratio of 88:10:1:1.

For Sample C, a paste-like material for forming a negative electrode active material layer was prepared by using carbon black on which a coating film made of $LiNbO_3$ was formed in advance by the ADL method (referred to hereinbelow as "coated carbon black") and mixing the negative electrode active material, coated carbon black, SBR, and CMC in ion-exchanged water to obtain a mass ratio of 88:10:1:1.

Sheet-shaped negative electrodes for Samples A to C were fabricated by uniformly applying any of the obtained materials for forming a negative electrode active material layer to both surfaces of copper foil (negative electrode collector: thickness 14 μm), drying, and then performing compression treatment with a roll press.

Lithium ion secondary batteries of Samples A to C for evaluation were then constructed. With respect to the positive electrode and negative electrode to be used, the size (and applied amount of active material layers) of the positive and negative electrodes were adjusted to obtain the designed capacity of the constructed lithium ion secondary batteries of 15 mAh.

An electrode body was formed by arranging the fabricated sheet-shaped positive electrode and negative electrode facing each other with a separator being interposed therebetween. A separator sheet of a three-layer structure (thickness: 20 μm) formed of PP/PE/PP was used as the separator. A sealed lead was attached to the tab of each electrode. The laminated electrode body configured in the above-described manner was accommodated in a laminated film bag, and a nonaqueous electrolytic solution was poured into the bag. A solution prepared by using the abovementioned fluorinated cyclic carbonate (FEC) and fluorinated chain carbonate (MTFEC) which were mixed at a volume ratio of 1:1 and dissolving $LiPF_6$ as a support salt at a concentration of about 1 mol/L in the nonaqueous solvent was used as the nonaqueous electrolytic solution.

The laminated film bag in which the laminated electrode body and nonaqueous electrolytic solution were accommodated was sealed (hermetically sealed) by thermally welding the opening, while clamping the seal portions attached to the leads and evacuating the interior of the bag, to obtain laminated lithium ion secondary batteries of three types for evaluation (Samples A to C).

<Evaluation of High-Rate Characteristic (Resistance Increase Rate)>

First, an initial resistance was determined for each sample battery. More specifically, the batteries (Samples A to C) after conditioning treatment were CC charged at a rate of ⅓ C to a state of charge (SOC) of 60% under a temperature environment of 25° C. Then, the batteries adjusted to a state of SOC 60% were CC discharged at a rate of 20 C, and a voltage drop amount in 10 sec after the start of the discharge was measured. An IV resistance value (Ω) was calculated by dividing the measured value (V) of voltage drop by the corresponding current value. Here, "1 C" means a current value (current density) at which a battery capacity (Ah) estimated from the theoretic capacity of a positive electrode can be charged for 1 h. Therefore, ⅓ C means a current value at which the battery capacity can be charged for 3 h, and 20 C means a current value at which the battery capacity can be charged for 1/20 of 1 h.

Each sample battery after the initial IV resistance value was measured was repeatedly subjected to 2000 cycles of charging and discharging, and the resistance value after 2000 cycles was measured. More specifically, one cycle was performed under the following conditions of charging and discharging: discharging at 20 C for 30 s under a temperature environment of 25° C., allowing the battery to stand for 30 min, and then charging at 2 C for 5 min, and allowing the battery to stand for 30 min. The charging state was adjusted to obtain a SOC of 60% for every 500 cycles of charging and discharging.

A resistance increase ratio after 2000 cycles of charging and discharging with respect to the determined initial resistance was determined by taking the initial resistance value as 100. The results are depicted in FIG. 2.

Figure 2:
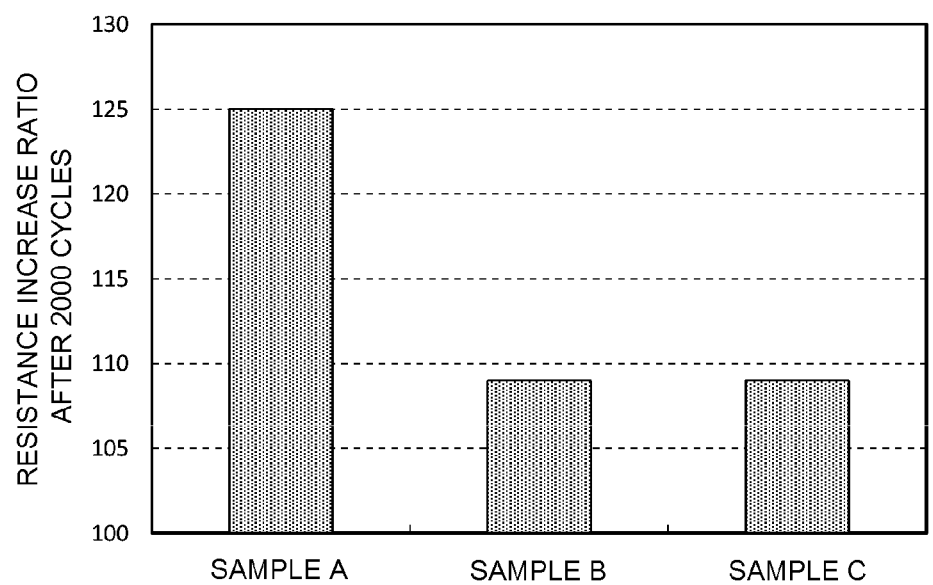
FIG. 2 is a graph illustrating the effect produced by the inclusion of carbon black in the negative electrode active material layer of the lithium ion secondary battery on the resistance increase ratio after a charge-discharge cycle (2000 cycles) test conducted at 25° C.

The graph depicted in FIG. 2 clearly indicates that in the battery of Sample B and the battery of Sample C in which the negative electrode active material layer included carbon black had a resistance increase ratio markedly lower than that of the battery of Sample A, regardless of the presence of the coating film on the contained carbon black. This result indicates that the inclusion of the electrically conductive carbon black in the negative electrode active material ensures excellent high-rate characteristic (effect of suppressing the resistance increase ratio).

<Evaluation of Durability (Cycle Characteristic)>

Each sample battery constructed in the above-described manner was placed under a temperature environment of 60° C. and constant-current charged at 2 C to 4.9 V. The batteries were then discharged to 3.5 V at the same current density of 2 C. Such charging and discharging being taken as 1 cycle, a total of 200 cycles were repeated. A capacity decrease ratio (%) was calculated as an indicator of durability (cycle characteristic) from the initial capacity and capacity after 200 cycle. More specifically, the capacity decrease ratio (%) was determined from the following equation.

Capacity decrease ratio (%)=(initial battery capacity−battery capacity after 200 cycles)/(initial battery capacity)×100.

Figure 3:
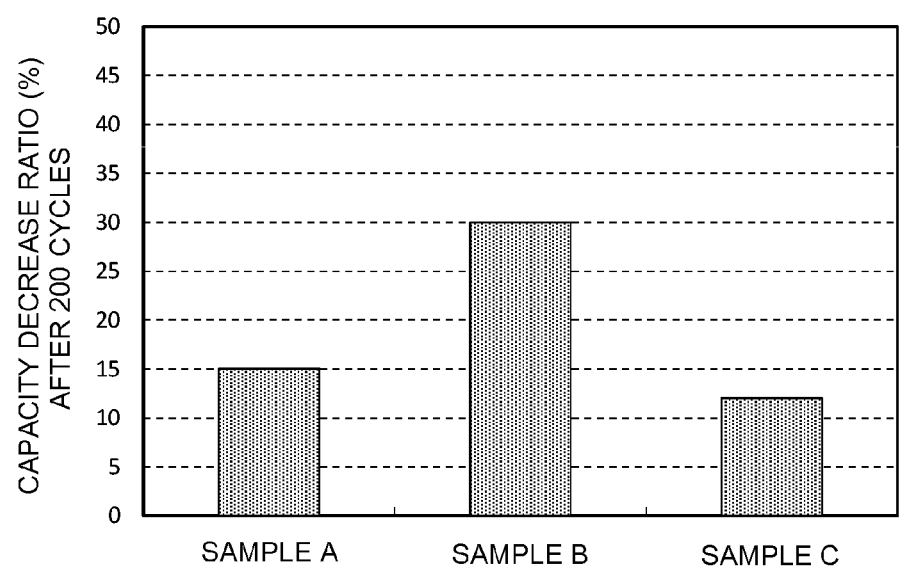
FIG. 3 is a graph illustrating the effect produced by the formation of a coating film made of a lithium-ion-conductive lithium transition metal composite oxide on the surface of carbon black included in the negative electrode active material layer of the lithium ion secondary battery on the capacity decrease ratio (capacity retention ratio) after a charge-discharge cycle (200 cycles) test conducted at 60° C.

The results are depicted in FIG. 3. The graphs clearly indicate that in the battery of Sample B in which non-coated carbon black was included in the negative electrode active material layer, a very high value of capacity decrease ratio was demonstrated. By contrast, in the battery of Sample C in which the coated carbon black was included in the negative electrode active material layer, the capacity retention ability equal to or better than that of the battery of Sample A was demonstrated. This is because by forming a coating film made of a lithium transition metal composite oxide having lithium ion conductivity on the surface of the carbon black, it is possible to suppress the decomposition of the nonaqueous electrolytic solution and eventually the generation and growth of the passivation film on the negative electrode surface and also suppress the decrease in capacity.

<Evaluation of Low-Temperature Characteristic>

In order to evaluate the low-temperature durability, the SOC of each sample battery was adjusted to 60% by fully charging each sample battery constructed in the above-described manner, then discharging the batteries for some time, and constant-current charging at a current density of ⅕ C to a capacity corresponding to 60% of the initial capacity under a temperature environment of −10° C. The charge overvoltage was then measured with respect to each sample battery by allowing a constant current of ⅓ C, 1 C, 3 C to flow for 10 s from the state with a SOC of 60%, and the average value of the resistance calculated by dividing the measurement results by the current value was taken as a −10° C. charging resistance value (Ω). The relative values of the −10° C. charging resistance value of Sample B and Sample C obtained when the −10° C. charging resistance value of the battery of Sample A was taken as 100 are depicted in FIG. 4.

Figure 4:
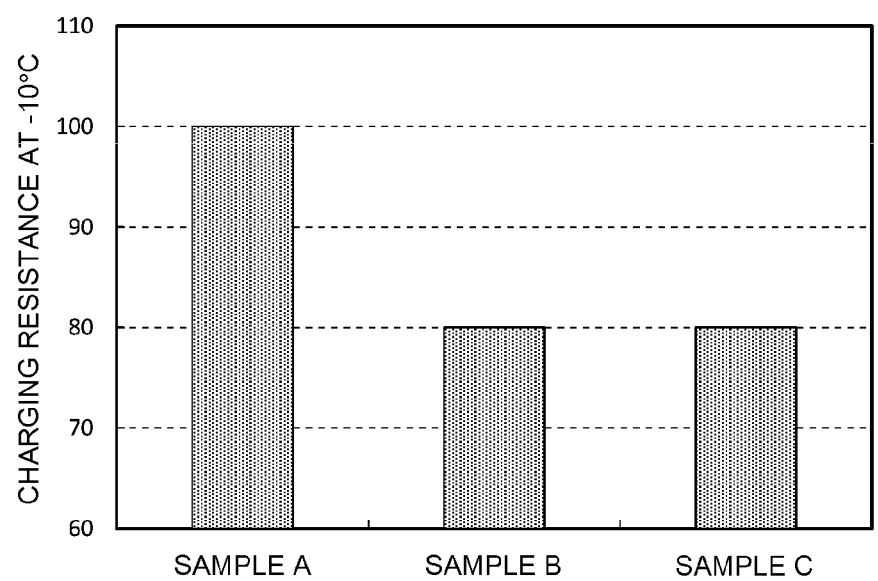
FIG. 4 is a graph illustrating the degree of decrease in charging resistance at a low temperature (−10° C.) which is caused by the inclusion of carbon black in the negative electrode active material layer of the lithium ion secondary battery.

The graphs depicted in FIG. 4 clearly indicate that the battery of Sample B and the battery of Sample C, in which the negative electrode active material layer included carbon black, had a low −10° C. charging resistance value and excellent low-temperature characteristic (low-temperature durability), regardless of the presence of the coating film on the contained carbon black.

The present teaching is explained hereinabove in detail, but the embodiments thereof are merely illustrating, and the teaching disclosed herein is inclusive of various changes and modifications of the above-described specific example. Since the nonaqueous electrolytic solution secondary battery (typically, the lithium ion secondary battery) disclosed herein demonstrates, as mentioned hereinabove, excellent high-rate characteristic and durability (cycle characteristic), it can be advantageously used, for example, as a drive power source for a motor (electric motor) installed on a vehicle such as an automobile.

What is claimed is:

1. A nonaqueous electrolytic solution secondary battery comprising a positive electrode provided with a positive electrode active material layer, a negative electrode provided with a negative electrode active material layer, and a non-aqueous electrolytic solution, wherein
    the negative electrode active material layer includes a negative electrode active material and carbon black, and
    a coating film made of a lithium transition metal composite oxide having lithium ion conductivity is formed on at least part of a surface of the carbon black.

2. The nonaqueous electrolytic solution secondary battery according to claim 1, wherein the coating film includes a lithium-ion-conductive lithium transition metal composite oxide that includes niobium (Nb) as a transition metal element.

3. The nonaqueous electrolytic solution secondary battery according to claim 1, wherein spherical graphite with an average value of circularity of 0.9 or more and an average particle diameter of 5 μm (inclusive) to 15 μm (inclusive) is included as the negative electrode active material.

4. A method for manufacturing a nonaqueous electrolytic solution secondary battery including a positive electrode provided with a positive electrode active material layer, a negative electrode provided with a negative electrode active material layer, and a nonaqueous electrolytic solution, the method comprising:
    forming a positive electrode by forming a positive electrode active material layer on a positive electrode collector; and
    forming a negative electrode by forming a negative electrode active material layer on a negative electrode collector, wherein
    the negative electrode active material layer is formed such as to include at least a negative electrode active material and carbon black in which a coating film made of a lithium transition metal composite oxide having lithium ion conductivity is formed on at least part of the surface, and
    the coating film is formed by depositing the lithium transition metal composite oxide on the surface of the carbon black by an atomic layer deposition method.

* * * * *